(12) United States Patent
Kim et al.

(10) Patent No.: US 9,383,577 B2
(45) Date of Patent: Jul. 5, 2016

(54) MEMS SCANNER

(71) Applicant: KOREA OPTRON CORP., Gwangju (KR)

(72) Inventors: Kyungsu Kim, Gwangju (KR); Junil Kim, Gwangju (KR); Jonghyun Lee, Gwangju (KR); Seunghwan Moon, Gwangju (KR)

(73) Assignee: KOREA OPTRON CORP., Gwangju (KR)

( * ) Notice: Subject to any disclaimer, the term of this patent is extended or adjusted under 35 U.S.C. 154(b) by 53 days.

(21) Appl. No.: 14/403,308

(22) PCT Filed: Oct. 11, 2013

(86) PCT No.: PCT/KR2013/009089
§ 371 (c)(1),
(2) Date: Nov. 24, 2014

(87) PCT Pub. No.: WO2015/053422
PCT Pub. Date: Apr. 16, 2015

(65) Prior Publication Data
US 2016/0131893 A1      May 12, 2016

(51) Int. Cl.
*G02B 26/08*    (2006.01)
*G02B 26/10*    (2006.01)

(52) U.S. Cl.
CPC .......... *G02B 26/0841* (2013.01); *G02B 26/105* (2013.01)

(58) Field of Classification Search
CPC ............. G02B 26/0841; G02B 26/105; G02B 26/0816; G02B 6/3518; G02B 6/3564; G02B 6/357; G02B 7/023; B81B 2207/07; B81B 2201/033; B81B 2203/058
USPC .......... 359/199.2, 200.6, 221.2, 224.1–224.2, 359/298; 310/309
See application file for complete search history.

(56) References Cited

U.S. PATENT DOCUMENTS

2004/0081391 A1*   4/2004   Ko ...................... B81B 3/0062
                                                            385/18

FOREIGN PATENT DOCUMENTS

| JP | 2005088187 A | 4/2005 |
| JP | 2003057574 A | 2/2006 |
| KR | 1020040035116 A | 4/2004 |
| KR | 1020060092053 A | 8/2006 |

OTHER PUBLICATIONS

International Search Report for PCT/KR2013/009089 dated Jul. 7, 2014.

* cited by examiner

*Primary Examiner* — James Phan
(74) *Attorney, Agent, or Firm* — Hauptman Ham, LLP

(57) ABSTRACT

The present invention relates to a micro electro mechanical systems (MEMS) scanner, and more particularly, to an MEMS scanner for implementing stable driving while increasing a driving angle between a fixed electrode and a driving electrode using an MEMS process. The MEMs scanner comprises a lower frame, a pair of upper frames, a pair of levers, a pair of fixed electrode portions, and a driving electrode portion.

19 Claims, 12 Drawing Sheets

(B)

MEMS SCANNER

TECHNICAL FIELD

The present invention relates to a micro electro mechanical systems (MEMS) scanner, and more particularly, to an MEMS scanner for implementing stable driving while increasing a driving angle between a fixed electrode and a driving electrode using an MEMS process.

BACKGROUND ART

Recently, researches on micro electro mechanical systems (MEMS) devices manufactured by semiconductor process techniques are actively in progress in various technical fields such as displays, printing devices, precision measuring, precision processing, or the like. For example, an optical scanner having a micro structure is drawing attentions in a display field in which light incident from a light source is radiated on a predetermined screen area to implement a video or a scanning field in which light is scanned on a predetermined screen area and reflected light is received to read out image information.

Such an optical scanner refers to one in which a reflective mirror for reflecting light, a support axis for supporting the reflective mirror, and driving means for moving the reflective mirror are implemented as a single chip.

A comb-shaped driver has driving electrodes that are disposed in parallel on the plane of a moving structure or a stage that is a moving object, and fixed electrodes corresponding to the driving electrodes have a structure in which the fixed electrodes are alternately disposed with respect to the driving electrodes while being fixed and are disposed in parallel on the plane surface of the stage along with the driving electrodes.

In order to allow the electrostatic type driver to have a rotational movement in an electrostatic driving condition, a height difference or a slope is required between the driving electrode and the fixed electrode. Since an additional process for causing one of the driving electrode and the fixed electrode to have a different height or an additional process for causing the height to be inclined after making both heights same as each other is required for the comb-shaped driver, it becomes complicated to manufacture the optical scanner.

Methods of forming an initial angle for the driving electrode are as follows.

First, a method may be employed which deposits a polymer between an upper end of a driving electrode and an upper end of a driving portion to connect the driving electrode with the driving portion, and heat-deforms the polymer to shrink the polymer, thereby inclining the driving electrode. There are limits to this method in terms of high speed driving of the optical scanner, complicated manufacturing processes, and a manufacturing reproducibility for forming a constant initial angle of the driving electrode.

Another method is to have a rotational spring subjected to plastic deformation using Joul-heating while the spring is intentionally inclined to form an initial angle. There is a limit to this method in terms of the driving angle because the optical scanner can only be driven in uni-direction at the time of electrostatically driving the optical scanner.

Yet another method is to form an initial angle using an assembly. According to this method, an additional separate structure needs to be coupled to an optical scanner in order to form the initial angle for the driving electrode, which thus causes the manufacturing process to be complicated and the manufacturing cost to be increased. In addition, a volume of the optical scanner is inevitably increased due to the added structure. Moreover, since a spring of the driving portion and a hinge of the fixed electrode are structurally connected to each other, the spring of the driving portion and the driving electrode also simultaneously rotate when the fixed electrode is inclined, so that the initial angle is not formed. Accordingly, in order to prevent the driving electrode from being rotated, the spring of the driving portion needs to be intentionally twisted, which causes the spring of the driving portion to have a residual stress even when the optical scanner is not driven. This causes unstable driving such as fatigue failures in the long term and a poor impact resistance to occur in terms of driving the optical scanner.

DISCLOSURE

Technical Problem

The present invention is thus directed to providing an MEMS scanner for implementing stable driving while increasing a driving angle between a fixed electrode and a driving electrode using an MEMS process.

The present invention is also directed to providing a method capable of reducing a manufacturing cost while having an MEMS scanner small-sized by means of manufacturing process simplification.

Technical Solution

One aspect of the present invention provides an MEMS scanner including a lower frame, a pair of upper frames, a pair of levers, a pair of fixed electrode portions, and a driving electrode portion. The lower frame has cavities downward from an upper surface of the lower frame, and a through-hole is formed between the cavities. The pair of upper frames are attached to the upper surface of the lower frame near the cavities to form an installation space in a central portion between the upper frames. The pair of levers are disposed inside the respective upper frames, is attached to both sides of a bottom surface of the cavities around the through-hole, and is connected to the respective upper frames. The pair of fixed electrode portions of which one sides are connected to the respective levers and the other sides are connected to the respective upper frames have a plurality of fixed electrodes that can be sloped toward an upper surface of the upper frames with respect to the bottom surface of the cavities, and the plurality of fixed electrodes are formed toward the through-hole. The driving electrode portion has a plurality of driving electrodes formed at both sides thereof, the plurality of driving electrodes are alternately disposed with respect to the fixed electrodes of the pair of fixed electrode portions and are disposed in parallel on the upper surfaces of the respective upper frames, and sides opposite to the both sides in which the plurality of driving electrodes are disposed are attached to the upper surface of the lower frame using respective rotational springs. In this case, when a voltage is applied between the driving electrode portion and one of the pair of fixed electrode portions to generate a potential difference, the driving electrode portion rotates toward the fixed electrode portion to which the voltage is applied.

In the MEMS scanner according to the present invention, the pair of upper frames may include a first upper frame and a second upper frame. The first upper frame may surround an outer surface of a first lever of the pair of levers and may be attached to the upper surface of the lower frame. The second upper frame may surround an outer surface of a second lever of the pair of levers, may be attached to the upper surface of the lower frame, and may form an installation space in a central portion between the first and second upper frames. In this case, the pair of levers, the pair of fixed electrode portion, and the driving electrode portion may be positioned in the installation space.

In the MEMS scanner according to the present invention, the pair of fixed electrode portions may be disposed to surround an outer surface of the driving electrode portion with the driving electrode portion as a center, and the levers may be disposed rear of the pair of fixed electrode portions, respectively.

In the MEMS scanner according to the present invention, each of the pair of levers may include a pair of connection plates and lever plates. The pair of connection plates may be connected to the respective upper frames at both sides of the connection plates using a first lever hinge. Both ends of one sides of the lever plates may be connected to the respective connection plates using a second lever hinge, the lever plates may be fixed to the bottom surface of the cavities, and both ends of the other sides of the lever plates may be connected to the respective fixed electrode portions using a third lever hinge.

In the MEMS scanner according to the present invention, the third lever hinge of the pair of levers may be positioned at a side closer to the through-hole with the first lever hinge as a center, and the second lever hinges may be positioned at a side opposite to the sides at which the third lever hinge is positioned.

In the MEMS scanner according to the present invention, a plurality of adhesive injection holes may be formed to penetrate each of the lever plates. The lever plates may be attached to the bottom surface of the respective cavities using the adhesive injected through the plurality of adhesive injection holes.

In the MEMS scanner according to the present invention, each of the pair of fixed electrode portions may include a fixed electrode frame, a plurality of fixed electrodes, and a hinge installation piece. The fixed electrode frame may be connected to the lever using the third lever hinge. The plurality of fixed electrodes may be arranged at one side of the fixed electrode frame toward the through-hole. The hinge installation piece may extend to both sides of the fixed electrode frame with the plurality of fixed electrodes as a center, and may be connected to the fixed electrode frame using fixed hinges.

In the MEMS scanner according to the present invention, the hinge installation pieces may be disposed on the cavities.

In the MEMS scanner according to the present invention, the fixed electrodes of the pair of fixed electrode portions may be spaced from each other to form a space in which the driving electrode portion is installed.

In the MEMS scanner according to the present invention, the driving electrode portion may include a driving electrode frame, a plurality of driving electrodes, a pair of spring installation pieces, and a pair of rotational springs. The driving electrode frame may be disposed in a space between the fixed electrodes of the pair of fixed electrode portions. The plurality of driving electrodes may be formed at sides of the driving electrode frame in which the fixed electrodes of the pair of fixed electrode portions face, and may be disposed alternately with respect to the fixed electrodes of the pair of fixed electrode portions. The pair of spring installation pieces may be formed at both sides adjacent to sides in which the plurality of driving electrodes are formed, and may be fixed to the upper surface of the lower frame. The pair of rotational springs may connect the spring installation pieces with the driving electrode frame.

In the MEMS scanner according to the present invention, the fixed hinges and the rotational springs may be disposed on the same axis.

In the MEMS scanner according to the present invention, when a voltage is applied between the driving electrode portion and one of the pair of fixed electrode portions to generate a potential difference, the driving electrode portion may rotate toward the fixed electrode portion to which the voltage is applied, and the driving electrodes may rotate until the driving electrode portion is in parallel on the fixed electrode portions.

In the MEMS scanner according to the present invention, the fixed electrodes and the driving electrodes may be inter-digitated.

In the MEMS scanner according to the present invention, a mirror may be formed in the driving electrode frame of the driving electrode portion, or a portion of the driving electrode frame may be penetrated and a lens may be coupled to the penetrated portion.

In the MEMS scanner according to the present invention, when a mirror is formed in the driving electrode frame of the driving electrode portion, a metallic film may be deposited on the driving electrode portion including the mirror and the fixed electrode portions.

In the MEMS scanner according to the present invention, when a lens is coupled to the driving electrode frame of the driving electrode portion, a metallic film may be deposited on the driving electrode portion and the fixed electrode portions except the lens.

In the MEMS scanner according to the present invention, the metallic film may be formed of gold or aluminum.

Advantageous Effects

An MEMS scanner according to the present invention can implement stable driving while increasing a driving angle between a fixed electrode and a driving electrode using a step of cavities formed in a lower frame manufactured through an MEMS process.

In addition, since a driving electrode portion along with fixed electrode portions is supported by the lower frame but is physically separated from the fixed electrode portions, the driving electrode portion and the fixed electrode portions structurally do not have an influence on each other. It is thus possible for the driving electrode portion to rotate in accordance with a potential difference generated between the driving electrode portion and the fixed electrode portions while not being physically influenced by the fixed electrode portions. In addition, since rotational springs of the driving electrode portion are positioned with no elasticity caused by torsion when a voltage is not applied, it is possible to suppress fatigue failures caused by a long term use.

In addition, the MEMS scanner according to the present invention is manufactured by the MEMS process in the order of manufacturing a lower frame and then stacking an original upper plate on the lower frame. A pair of upper frames, a pair of levers, a pair of fixed electrode portions, and a driving electrode portion are then manufactured on the original upper plate using a silicon deep reactive ion etch (Si DRIE) process and only the levers are attached to cavities of the lower frame, thereby allowing a process of additionally manufacturing individual structures for inclining the fixed electrode portions as in the related art to be omitted. As a result, the MEMS scanner can be small-sized and the manufacturing cost can be reduced using the manufacturing process simplification of the MEMS scanner.

MODES OF THE INVENTION

Note that only portions necessary to understand embodiments of the present invention will be described hereinafter, and the other portions will be omitted in a range that does not obscure the gist of the present invention.

Terms or words used herein and the following claims should not be construed as limited to conventional or dictionary definition but as meanings and concepts meeting the technical spirit of the present invention based on the principle that the inventor could appropriately define concepts of the terms to describe the best mode of the invention. Accordingly, configurations illustrated in embodiments and drawings used herein are merely preferred embodiments of the present invention and do not represent all technical spirits of the present invention, and it will be understood that various equivalents and modifications may be made to replace the embodiments at the time of filing the present application.

Hereinafter, embodiments of the present invention will be described in detail with reference to accompanying drawings.

Figure 1:
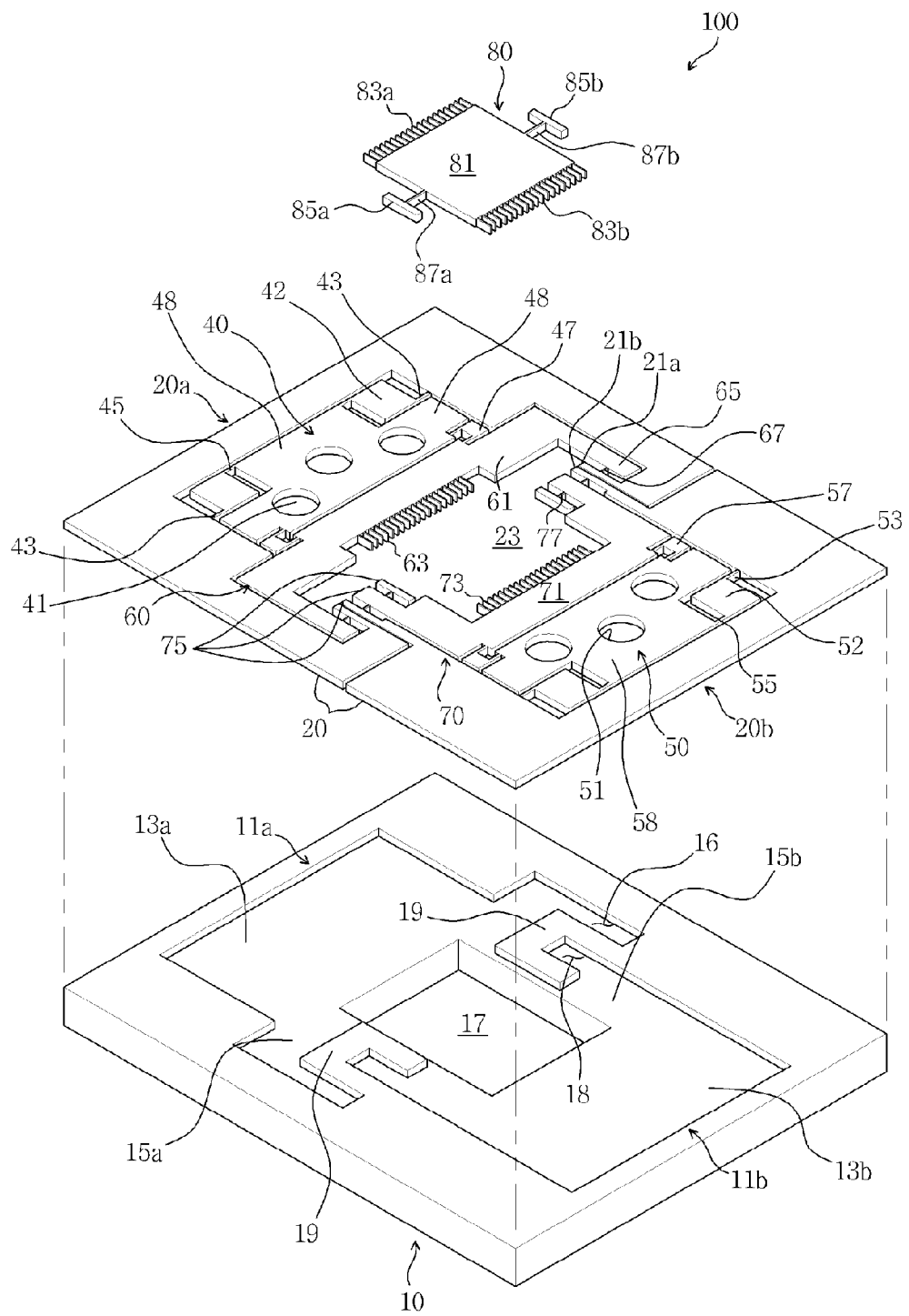
FIG. 1 illustrates an exploded perspective view of an MEMS scanner according to an embodiment of the present invention.
Figure 2:
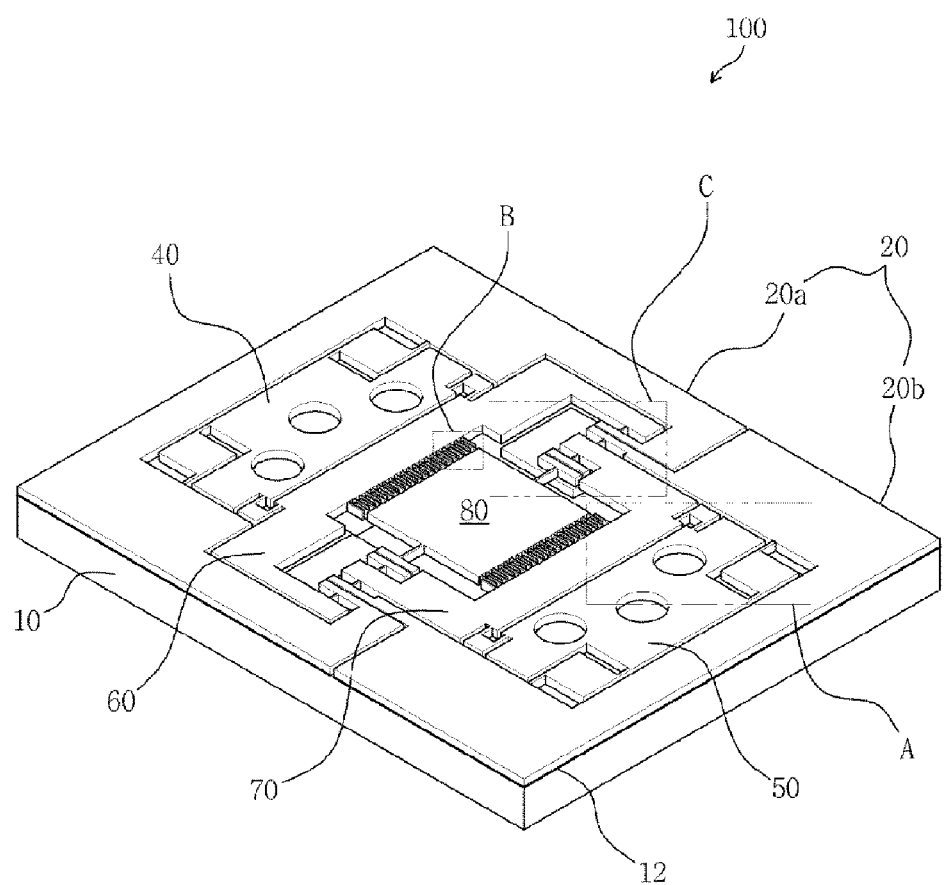
FIG. 2 illustrates a perspective of the MEMS scanner of FIG. 1.

FIG. 1 illustrates an exploded perspective view of an MEMS scanner according to an embodiment of the present invention. FIG. 2 illustrates a perspective view of the MEMS scanner of FIG. 1.

Referring to FIGS. 1 and 2, an MEMS scanner 100 according to the present embodiment includes a lower frame 10, a pair of upper frames 20, a pair of levers 40 and 50, a pair of fixed electrode portions 60 and 70, and a driving electrode portion 80. The lower frame 10 has cavities 11a and 11b formed downward from an upper surface of the lower frame, and a through-hole 17 between the cavities 11a and 11b. The pair of upper frames 20 are attached to the upper surface of the lower frame 10 near the cavities 11a and 11b, thereby forming an installation space 23 in the central portion between the upper frames. The pair of levers 40 and 50 are attached to both bottom surfaces of the cavities 11a and 11b with the through-hole 17 disposed therebetween, and are connected to the pair of upper frames 20, respectively. One ends of fixed electrode portions 60 and 70 are connected to the respective levers 40 and 50 and the other ends thereof are connected to the upper frames 20, the pair of fixed electrode portions have a plurality of fixed electrodes 63 and 73 that can be sloped toward an upper surface of the upper frames 20 with respect to the bottom surfaces of the cavities 11a and 11b, and the plurality of fixed electrodes 63 and 73 are disposed toward the through-hole 17. The driving electrode portion 80 has a plurality of driving electrodes 83a and 83b that are alternately disposed with respect to the fixed electrodes 63 and 73 of the pair of fixed electrode portions 60 and 70 and that are disposed in parallel on the upper surfaces of the respective upper frames 20 at both sides of the driving electrode portion. Sides opposite to sides in which the plurality of driving electrodes 83a and 83b are formed are attached to the upper surface of the upper frames 20 using rotational springs 87a and 87b, respectively. In this case, when a voltage is applied between the driving electrode portion 80 and one of the fixed electrode portions 60 and 70 to generate a potential difference, the driving electrode portion 80 rotates toward the side to which the voltage is applied between the fixed electrode portions 60 and 70.

The MEMS scanner 100 according to the present embodiment as described above has a structure in which the pair of upper frames 20, the pair of levers 40 and 50, the pair of fixed electrode portions 60 and 70, and the driving electrode portion 80 are installed on the top of the lower frame 10. The pair of upper frames 20, the pair of levers 40 and 50, the pair of fixed electrode portions 60 and 70, and the driving electrode portion 80 are provided as one original upper plate and then formed as the pair of upper frames 20, the pair of levers 40 and 50, the pair of fixed electrode portions 60 and 70, and the driving electrode portion 80 using the MEMS process.

The pair of upper frames 20a and 20b include a first upper frame 20a and a second upper frame 20b disposed at both sides of the through-hole 17 of the lower frame 10, and one of the upper frames has a "⊂" shape and the other has a "⊃" shape to surround the through-hole 17. Both ends of which the first and second upper frames 20a and 20b meet are alternately formed.

The pair of levers 40 and 50, the pair of fixed electrode portions 60 and 70, and the driving electrode portion 80 are installed inside the first and second upper frames 20a and 20b. In this case, the pair of levers 40 and 50 are fixed and connected inside the first and second upper frames 20a and 20b, respectively. The pair of levers 40 and 50 include a first lever 40 and a second lever 50. The first lever 40 is connected to the first upper frame 20a. The second lever 50 is connected to the second upper frame 20b.

The fixed electrode portions 60 and 70 are rotatably connected to the first and second levers 40 and 50 inside the first and second levers 40 and 50, respectively. The pair of fixed electrode portions 60 and 70 include a first fixed electrode portion 60 and a second fixed electrode portion 70. The first fixed electrode portion 60 is rotatably connected to the first lever 40. The second fixed electrode portion 70 is rotatably connected to the second lever 50.

The driving electrode portion 80 is installed between the first and second fixed electrode portions 60 and 70. The driving electrode portion 80 is spaced from the first and second fixed electrode portions 60 and 70 to be independently formed.

The fixed electrodes 63 and 73 of the fixed electrode portions 60 and 70 are formed to be sloped by predetermined angles with respect to the driving electrodes 83a and 83b of the driving electrode portion 80 disposed in a horizontal direction using the cavities 11a and 11b formed on the upper surface of the lower frame 10. The slope of the fixed electrodes 63 and 73, that is, an initial angle is determined by the depth of the cavities 11a and 11b formed on the upper surface of the lower frame 10.

In the MEMS scanner 100 according to the present embodiment as described above, when a voltage is applied between the driving electrode portion 80 and one of the pair of fixed electrode portions 60 and 70 to generate a potential difference, the driving electrode portion 80 rotates toward the side to which the voltage is applied between the fixed electrode portions 60 and 70. In this case, the driving electrodes 83a and 83b of the driving electrode portion 80 rotate until the driving electrodes are in parallel on the fixed electrodes 63 and 73.

Each component of the MEMS scanner 100 according to the present embodiment will be described in detail.

The lower frame 10 provides a space on which the pair of upper frames 20, the pair of levers 40 and 50, the pair of fixed electrode portions 60 and 70, and the driving electrode portion 80 may be installed, and supports the pair of upper frames 20, the pair of levers 40 and 50, the pair of fixed electrode portions 60 and 70, and the driving electrode portion 80. The lower frame 10 has the cavities 11a and 11b formed by a predetermined depth from the upper surface of the lower frame, and the through-hole 17 is formed between the cavities 11a and 11b.

The pair of fixed electrode portions 60 and 70 are attached to a periphery edge of the upper surface of the lower frame 10 outside the cavities 11a and 11b using a silicon oxide ($SiO_2$) film. A hinge installation portion 19 is formed at both sides of and near the through-hole 17. In this case, the fixed electrodes 63 and 73 and the driving electrodes 83a and 83b are disposed at both sides of the through-hole 17. The hinge installation portion 19 may be disposed at both sides adjacent to the sides in which the fixed electrodes 63 and 73 and the driving electrodes 83a and 83b are disposed.

The cavities 11a and 11b include a first cavity 11a in which the first lever 40 and the first fixed electrode portion 60 are disposed, and a second cavity 11b in which the second lever 50 and the second fixed electrode portion 70 are disposed. The first cavity 11a is formed at one side of the through-hole 17 and the second cavity 11b is formed at the opposite side thereof.

The first cavity 11a includes a first lever fixed surface 13a in which the first lever 40 is installed, and a first fixing installation surface 15a in which the first fixed electrode portion 60 is installed. The second cavity 11b includes a second lever fixed surface 13b in which the second lever 50 is installed, and a second fixing installation surface 15b in which the second fixed electrode portion 70 is installed.

The cavities 11a and 11b include a first hinge installation piece space portion 16 and a second hinge installation piece space portion 18 formed at both sides of the hinge installation portion 19. Hinge installation pieces 65 and 75 of the first and second fixed electrode portions 60 and 70 are floated and positioned above the first and second hinge installation piece space portions 16 and 18.

The driving electrode portion 80 is disposed above the through-hole 17 disposed in the central portion between the cavities 11a and 11b. The through-hole 17 may prevent a mechanical interference between the driving electrode portion 80 and the lower frame 10 from occurring while the driving electrode portion 80 rotates. In addition, the through-hole 17 allows a fluid, for example, an air, present within the cavities 11a and 11b to be discharged through the through-hole 17 while the driving electrode portion 80 rotates, thereby reducing the reduction in rotational angle caused by the fluidal resistance during rotation of the driving electrode portion 80. In addition, the through-hole 17 may be used as a discharge port allowing an adhesive to be discharged through the through-hole 17 without adhering to the driving electrode portion 80 when the first and second levers 40 and 50 are bonded to the first and second lever fixed surfaces 13a and 13b of the lower frame 10 in a process of manufacturing the MEMS scanner 100, respectively.

The lower frame 10 may be formed of silicon, glass, or ceramic. A wafer formed of silicon may be used to form the pair of upper frames 20, the pair of levers 40 and 50, the pair of fixed electrode portions 60 and 70, and the driving electrode portion 80, which are disposed on the lower frame 10.

The pair of upper frames 20a and 20b include the first upper frame 20a and the second upper frame 20b as described above. The first upper frame 20a surrounds the outside of the first lever 40, and is attached to the upper surface of the lower frame 10. The second upper frame 20b surrounds the outside of the second lever 50 and is attached to the upper surface of the lower frame 10, and the second upper frame 20b along with the first upper frame 20a forms the installation space 23 at the central portion. The pair of levers 40 and 50, the pair of fixed electrode portions 60 and 70, and the driving electrode portion 80 are disposed in the installation space 23.

Both ends of the first and second upper frames 20a and 20b are alternately formed, and first and second hinge connection pieces 21a and 21b are formed in the alternating portions. The pair of second hinge connection pieces 21b may be formed inside the pair of first hinge connection pieces 21a formed at both sides thereof. The first and second hinge connection pieces 21a and 21b are attached to the hinge installation portion 19 formed in the lower frame 10.

Figure 3:
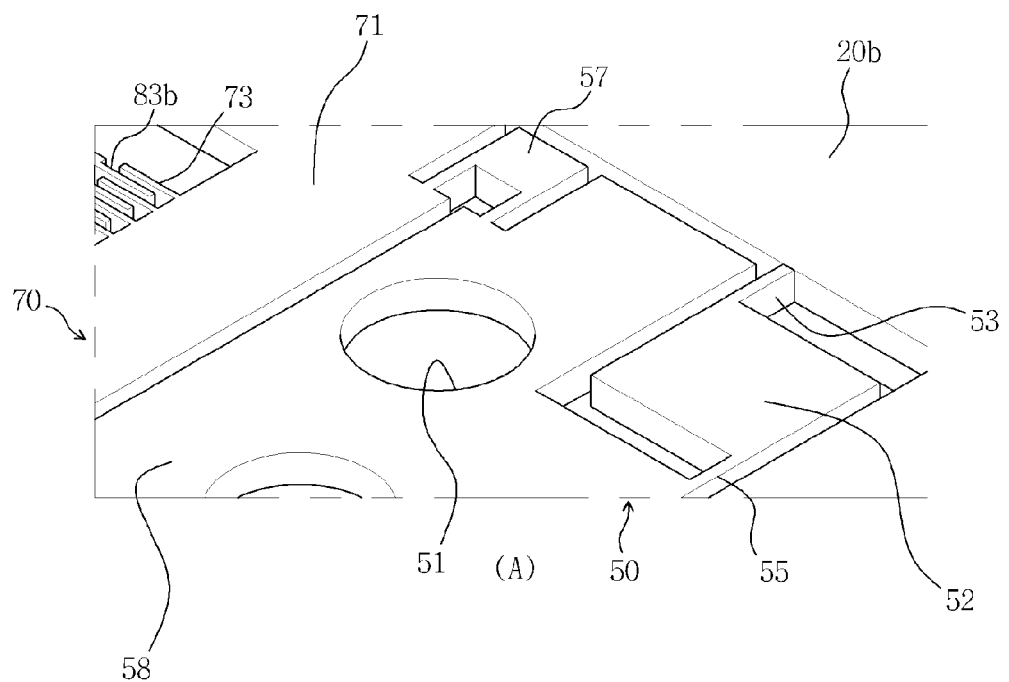
FIG. 3 illustrates an enlarged view of the "A" portion of FIG. 2.

The first and second levers 40 and 50 will be described with reference to FIGS. 1 to 3. In this case, FIG. 3 illustrates an enlarged view of the "A" portion of FIG. 2.

The first and second levers 40 and 50 are installed inside the first and second upper frames 20a and 20b, respectively. The first and second levers 40 and 50 have a pair of connection plates 42 and 52 and lever plates 48 and 58, respectively. The pair of connection plates 42 and 52 are connected to the upper frames 20a and 20b using first lever hinges 43 and 53, respectively. Both ends of one sides of the lever plates 48 and 58 are connected to the pair of respective connection plates 42 and 52 using respective second lever hinges 45 and 55, and are fixed to the bottom surfaces of the respective cavities 11a and 11b, and both ends of the other sides thereof are connected to the respective fixed electrode portions 60 and 70 using respective third lever hinges 47 and 57.

In addition, the third lever hinges 47 and 57 of the first and second levers 40 and 50 are positioned at sides closer to the through-hole 17 with the first lever hinges 43 and 53 as a center, and the second lever hinges 45 and 55 are positioned at sides opposite to the sides at which the third lever hinges 47 and 57 are positioned.

Figure 6:
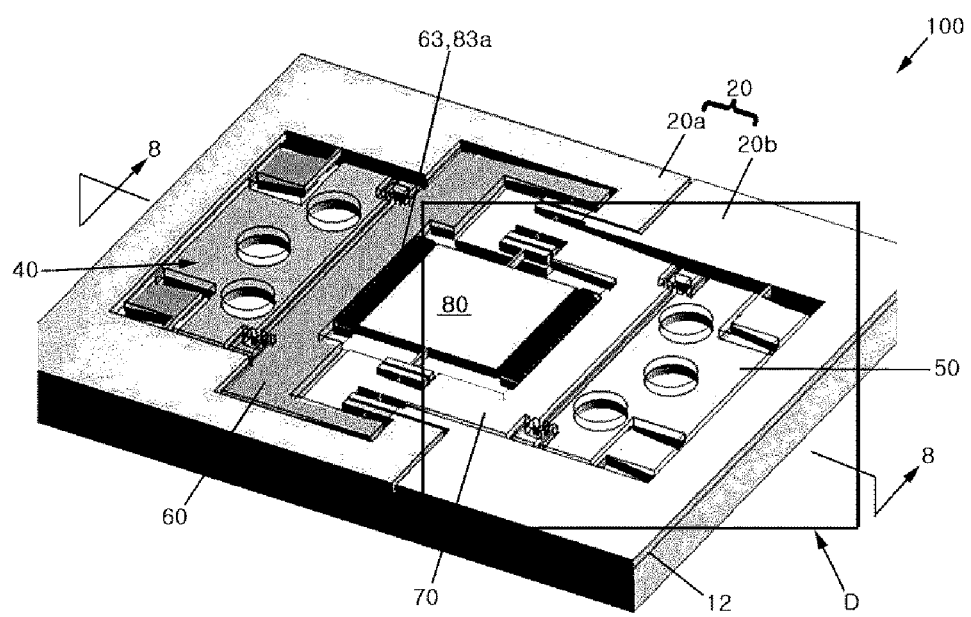
FIG. 6 illustrates a perspective view of which a lever of FIG. 2 is attached to a bottom of a cavity of a lower fixing portion.
Figure 7:
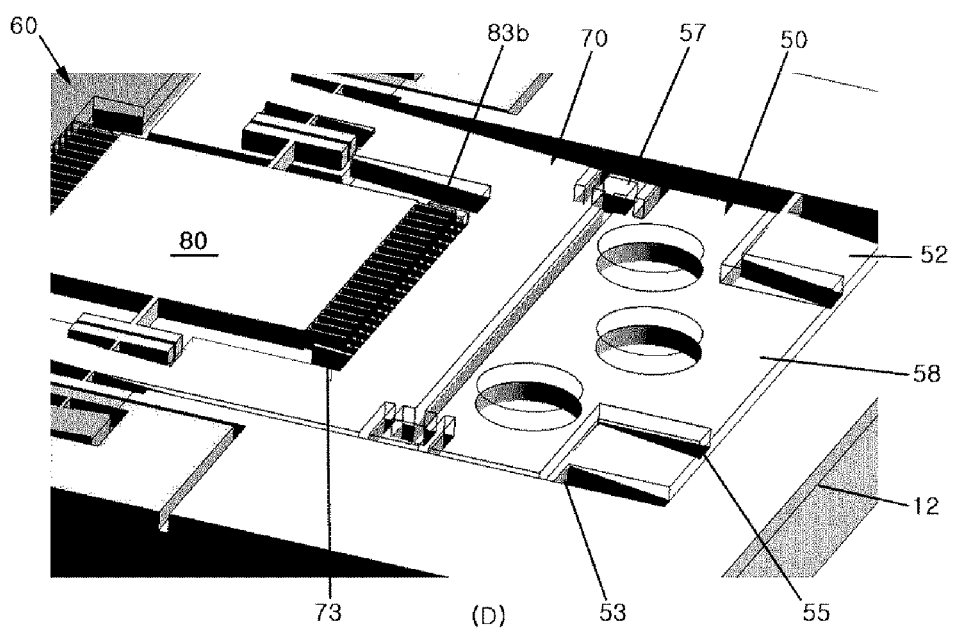
FIG. 7 illustrates an enlarged view of the "D" portion of FIG. 6.
Figure 8:
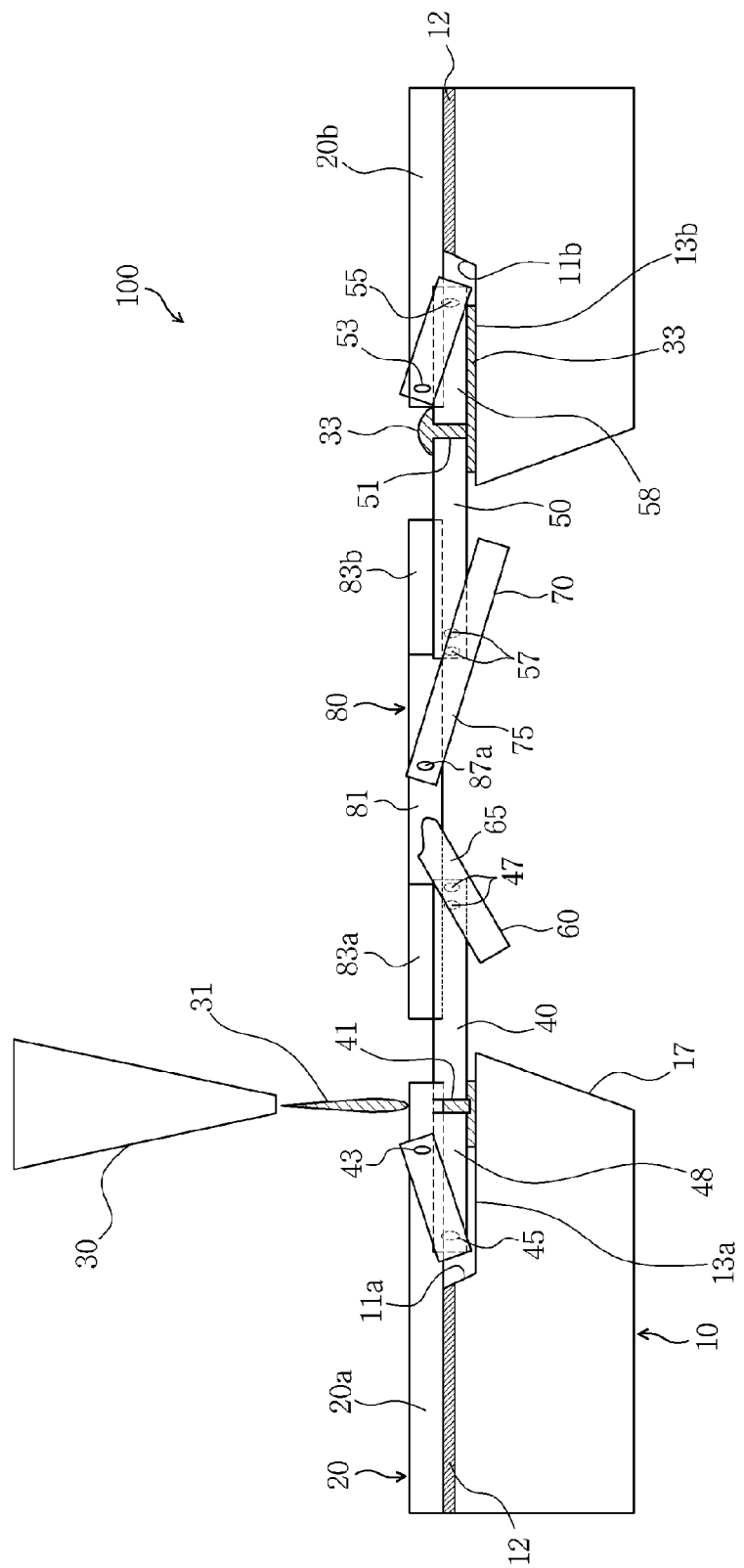
FIG. 8 illustrates a cross-sectional view taken along the 8-8 line of FIG. 6.

A plurality of adhesive injection holes 41 and 51 are formed to penetrate the respective lever plates 48 and 58, and the lever plates 48 and 58 are attached to the respective bottom surfaces of the cavities 11a and 11b, that is, the respective first and second lever fixed surfaces 13a and 13b using the adhesive injected through the plurality of adhesive injection holes 41 and 51. In other words, as shown in FIGS. 6 to 8, after an adhesive 31 is injected into the adhesive injection holes 41 and 51 by an adhesive supply member 30, the lever plates 48 and 58 are press-attached to the first and second lever fixed surfaces 13a and 13b of the cavities 11a and 11b, respectively. In this case, an adhesive layer 33 is formed between the first and second lever fixed surfaces 13a and 13b of the cavities 11a and 11b and the lever plates 48 and 58. A silicon-based or epoxy-based adhesive may be employed as the adhesive 31.

Since the lever plates 48 and 58 are attached to the first and second lever fixed surfaces 13a and 13b of the cavities 11a and 11b, the fixed electrodes 63 and 73 of the fixed electrode portions 60 and 70 connected to the lever plates 48 and 58 are inclined to an initial angle. The lever plates 48 and 58 may have a "T" shape, and have a structure in which the pair of connection plates 42 and 52 are connected to both sides of a vertical portion with respect to a horizontal portion. In this case, FIG. 6 illustrates a perspective view in which the levers 40 and 50 of FIG. 2 are attached to the bottom surfaces of the cavities of the lower frame 10. FIG. 7 illustrates an enlarged view of the "D" portion of FIG. 6. FIG. 8 illustrates a cross-sectional view taken along the 8-8 line of FIG. 6.

In this case, the first lever 40 and the second lever 50 are formed with the structure at both sides of the first and second upper frames 20a and 20b, respectively. The first lever 40 has the first connection plate 42, the first lever plate 48 in which the first adhesive injection hole 41 is formed, the 1-1 lever hinge 43, the 2-1 lever hinge 45, and the 3-1 lever hinge 47. The second lever 50 has the second connection plate 52, the second lever plate 58 in which the second adhesive injection hole 51 is formed, the 1-2 lever hinge 53, the 2-2 lever hinge 55, and the 3-2 lever hinge 57.

Figure 4:
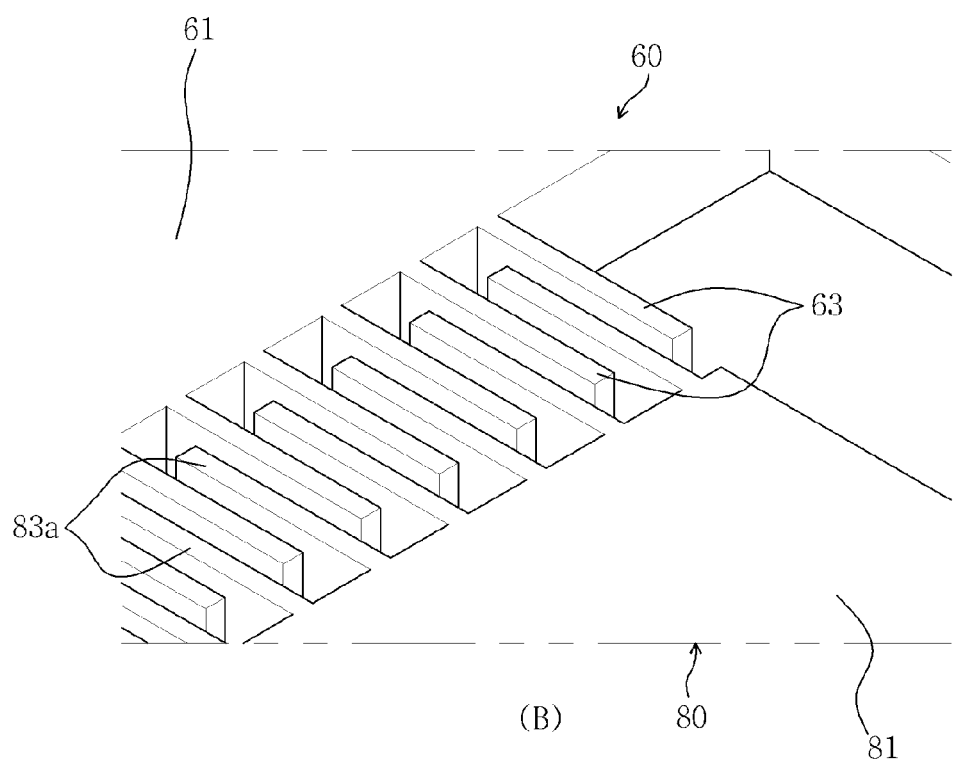
FIG. 4 illustrates an enlarged view of the "B" portion of FIG. 2.

The first and second fixed electrode portions 60 and 70 will be described with reference to FIGS. 1, 2, and 4. In this case, FIG. 4 illustrates an enlarged view of the "B" portion of FIG. 2.

The first and second fixed electrode portions 60 and 70 include fixed electrode frames 61 and 71, the plurality of fixed electrodes 63 and 73, and the hinge installation pieces 65 and 75, respectively. The fixed electrode frames 61 and 71 are connected to the levers 40 and 50 using the third lever hinges 47 and 57. The plurality of fixed electrodes 63 and 73 are arranged at one sides of the fixed electrode frames 61 and 71 toward the through-hole 17. The hinge installation pieces 65 and 75 are arranged toward both sides of the fixed electrode frames 61 and 71 with the plurality of fixed electrodes 63 and 73 as centers, and are connected to the hinge connection pieces 21a and 21b of the upper frames 20a and 20b using fixed hinges 67 and 77, respectively. The hinge installation piece space portions 16 and 18 are formed below the hinge installation pieces 65 and 75 to allow the hinge installation pieces 65 and 75 to rotate around the fixed hinges 67 and 77 with respect to the upper frames 20a and 20b, respectively.

The first and second fixed electrode portions 60 and 70 are formed with the same structure at both sides of the first and second levers 40 and 50, respectively. The first fixed electrode portion 60 includes the first fixed electrode frame 61, the plurality of first fixed electrodes 63, the first hinge installation piece 65, and the first fixed hinge 67. The second fixed electrode portion 70 includes the second fixed electrode frame 71, the plurality of second fixed electrodes 73, the second hinge installation piece 75, and the second fixed hinge 77.

The second hinge installation piece 75 of the second fixed electrode portion 70 is disposed inside the first hinge installation piece 65 of the first fixed electrode portion 60. The first hinge installation piece 65 is installed to be floated above the first hinge installation piece space portion 16 so as to allow the first hinge installation piece 65 to rotate around the first fixed hinge 67 with respect to the upper frame 20.

The second hinge installation piece 75 includes a 2-1 hinge installation piece 75a, and 2-2 and 2-3 hinge installation pieces 75b and 75c disposed at both sides of the 2-1 hinge installation piece 75a so as to allow the second hinge installation piece to be stably installed in the hinge installation portion 19. With the 2-1 hinge installation piece 75a as a center, the 2-2 hinge installation piece 75b is disposed to the side in which the first fixed hinge 67 is installed, and the 2-3 hinge installation piece 75c is disposed to the opposite side. The 2-1 hinge installation piece 75a and the 2-2 hinge installation piece 75b are connected using a 2-2 fixed hinge 77b. The 2-1 hinge installation piece 75a and the 2-3 hinge installation piece 75c are connected using a 2-1 fixed hinge 77a. The second fixed hinge 77 includes the 2-1 fixed hinge 77a and the 2-2 fixed hinge 77b. The 2-1 hinge installation piece 75a is installed to be floated above the second hinge installation piece space portion 18 so as to allow the 2-1 hinge installation piece 75a to rotate around the second fixed hinge 77 with respect to the upper frame 20.

Although the second hinge installation piece 75 is illustrated to be inside the first hinge installation piece 65 in the present embodiment, the present invention is not limited thereto. For example, the first hinge installation piece 65 and the second hinge installation piece 75 may be alternately formed. That is, the second hinge installation piece 75 may be formed inside the first hinge installation piece 65 at one side and the first hinge installation piece 65 may be formed inside the second hinge installation piece 75 at the other side.

Each of the first and second fixed electrodes 63 and 73 may be arranged in a row so that the first fixed electrodes face the second fixed electrodes, and a space in which the driving electrode portion 80 is installed is formed between the first and second fixed electrodes 63 and 73. The first and second fixed electrodes 63 and 73 may be interdigitated to have respective rectangular plate shapes.

The first and second fixed electrodes 63 and 73 are sloped to a constant angle, that is, an initial angle with respect to the horizontal surface as shown in FIGS. 6 and 7 when the lever plates 48 and 58 of the levers 40 and 50 are attached to the first and second lever fixed surfaces 13a and 13b of the cavities 11a and 11b, respectively. The first and second fixed hinges 67 and 77 are positioned on the same axis so as to allow the first and second fixed electrodes 63 and 73 to be sloped to the same initial angle. The first and second fixed electrodes 63 and 73 are arranged at an equal interval at both sides with the first and second fixed hinges 67 and 77 as an axis, respectively.

As described above, since the first and second levers 40 and 50 are attached to the first and second lever fixed surfaces 13a and 13b of the cavities 11a and 11b of the lower frame 10 and the first and second fixed hinges 67 and 77 of the first and second fixed electrode portions 60 and 70 are positioned on the upper surface of the lower frame 10, the first and second fixed electrode portions 60 and 70 rotate around the respective first and second fixed hinges 67 and 77 to allow the first and second fixed electrodes 63 and 73 to form the initial angle with respect to the horizontal surface.

Figure 5:
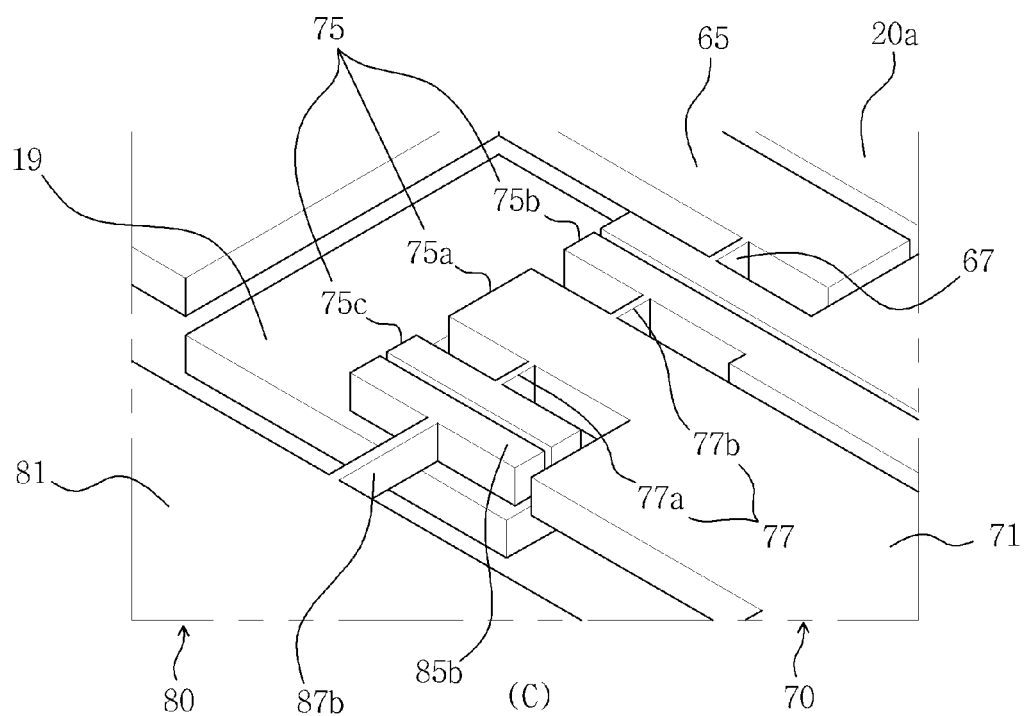
FIG. 5 illustrates an enlarged view of the "C" portion of FIG. 2.

The driving electrode portion 80 will be described with reference to FIGS. 1, 2, and 5. In this case, FIG. 5 illustrates an enlarged view of the "C" portion of FIG. 2.

The driving electrode portion 80 includes a driving electrode frame 81, the plurality of driving electrodes 83a and 83b, a pair of spring installation pieces 85a and 85b, and the pair of rotational springs 87a and 87b. The driving electrode frame 81 is disposed in a space between the first and second fixed electrodes 63 and 73. The plurality of driving electrodes 83a and 83b are formed at sides in which the driving electrode frame 81 faces the first and second fixed electrodes 63 and 73, and are disposed alternately with respect to the first and second fixed electrodes 63 and 73, respectively. The pair of spring installation pieces 85a and 85b are fixed to the upper surface of the lower frame 10 at both sides adjacent to the sides in which the plurality of driving electrodes 83a and 83b are formed. The pair of rotational springs 87a and 87b connect the pair of spring installation pieces 85a and 85b with the driving electrode frame 81.

In this case, the plurality of driving electrodes 83a and 83b may be interdigitated to have a rectangular shape corresponding to the fixed electrodes 63 and 73. The fixed electrodes 63 and 73 and the respective driving electrodes 83a and 83b are alternately disposed. The plurality of driving electrodes 83a and 83b include the first driving electrodes 83a alternately installed with respect to the first fixed electrodes 63, and the second driving electrodes 83b alternately installed with respect to the second fixed electrodes 73.

The driving electrodes 83a and 83b supported by the spring installation pieces 85a and 85b are horizontally installed, and the fixed electrodes 63 and 73 are disposed to be sloped to a constant angle with respect to the horizontally installed driving electrodes 83a and 83b.

The spring installation pieces 85a and 85b are attached to the hinge installation portion 19, and are positioned inside the 2-3 hinge installation piece 75c.

The rotational springs 87a and 87b are positioned on the same axis as the first and second fixed hinges 67 and 77. The reason why the rotational springs 87a and 87b are positioned on the same axis as the first and second fixed hinges 67 and 77 is as follows. When the driving electrode portion 80 statically rotates, the driving electrodes 83a and 83b may rotate until the driving electrodes are in parallel on the fixed electrodes 63 and 73. This moment corresponds to the angle by which the driving electrodes 83a and 83b can rotate geometrically as much as possible. When the rotational springs 87a and 87b are not positioned on the same axis as the first and second fixed hinges 67 and 77, the driving electrodes 83a and 83b cannot be in parallel on the fixed electrodes 63 and 73 even when the driving electrodes rotate to the maximum, which causes the angle by which the driving electrodes 83a and 83b can rotate to the maximum to be reduced compared with the case in which the rotational springs 87a and 87b are positioned on the same axis as the first and second fixed hinges 67 and 77.

As described above, since the driving electrode portion 80 according to the present embodiment along with the fixed electrode portions 60 and 70 is supported by the lower frame 10 but is physically separated from the fixed electrode portions, the driving electrode portion and the fixed electrode portions structurally do not have an influence on each other. The driving electrode portion 80 can thus have no physical influence from the fixed electrode portions 60 and 70 while rotating in accordance with the potential difference generated between the driving electrode portion 80 and the fixed electrode portions 60 and 70. In addition, since the rotational springs 87a and 87b of the driving electrode portion 80 are in a state in which an elasticity generated from the torsion is not applied when there is no voltage applied, fatigue failures due to a long-term use can be avoided.

The MEMS scanner 100 according to the present embodiment may be manufactured as follows. The MEMS scanner 100 according to the present embodiment may be manufactured in the order of manufacturing the lower frame 10, bonding an original upper plate to the lower frame, and having the original upper plate being subjected to Si DRIE (deep reactive ion etching) to form the pair of upper frames 20, the pair of levers 40 and 50, the pair of fixed electrode portions 60 and 70, and the driving electrode portion 80.

The process of manufacturing the MEMS scanner 100 according to the present embodiment will be described in detail. First, the cavities 11a and 11b and the through-hole 17 are formed in the lower frame 10 using the MEMS process.

A silicon oxide film 12 is grown on the lower frame 10 and the original upper plate, and the original upper plate is bonded to the lower frame 10.

The pair of upper frames 20, the pair of levers 40 and 50, the pair of fixed electrode portions 60 and 70, and the driving electrode portion 80 are manufactured in the bonded original upper plate using the Si DRIE process. In this case, the spring installation pieces 85a and 85b of the driving electrode portion 80 and the hinge installation pieces 65 and 75 of the fixed electrode portions 60 and 70 are positioned on the hinge installation portion 19 of the lower frame 10. The spring installation pieces 85a and 85b and the hinge installation pieces 65 and 75 are structurally separated from each other using the Si DRIE process.

When the pair of upper frames 20, the pair of levers 40 and 50, the pair of fixed electrode portions 60 and 70, and the driving electrode portion 80 are completely manufactured in the original upper plate, the adhesive 31 is injected through the adhesive injection holes 41 and 51 of the levers 40 and 50, and only the levers 40 and 50 are pressed and bonded to the first and second lever fixed surfaces 13a and 13b of the cavities 11a and 11b of the lower frame 10, thereby manufacturing the MEMS scanner 100 according to the present embodiment.

It is thus possible to reduce the cost for manufacturing the MEMS scanner 100 according to the present embodiment while allowing the MEMS scanner to be small-sized through manufacturing process simplification.

Driving the MEMS scanner 100 according to the present embodiment will be described with reference to FIGS. 9 to 12. In this case, FIGS. 9 to 12 are views illustrating driving of the MEMS scanner 100 according to an embodiment of the present invention.

Figure 9:
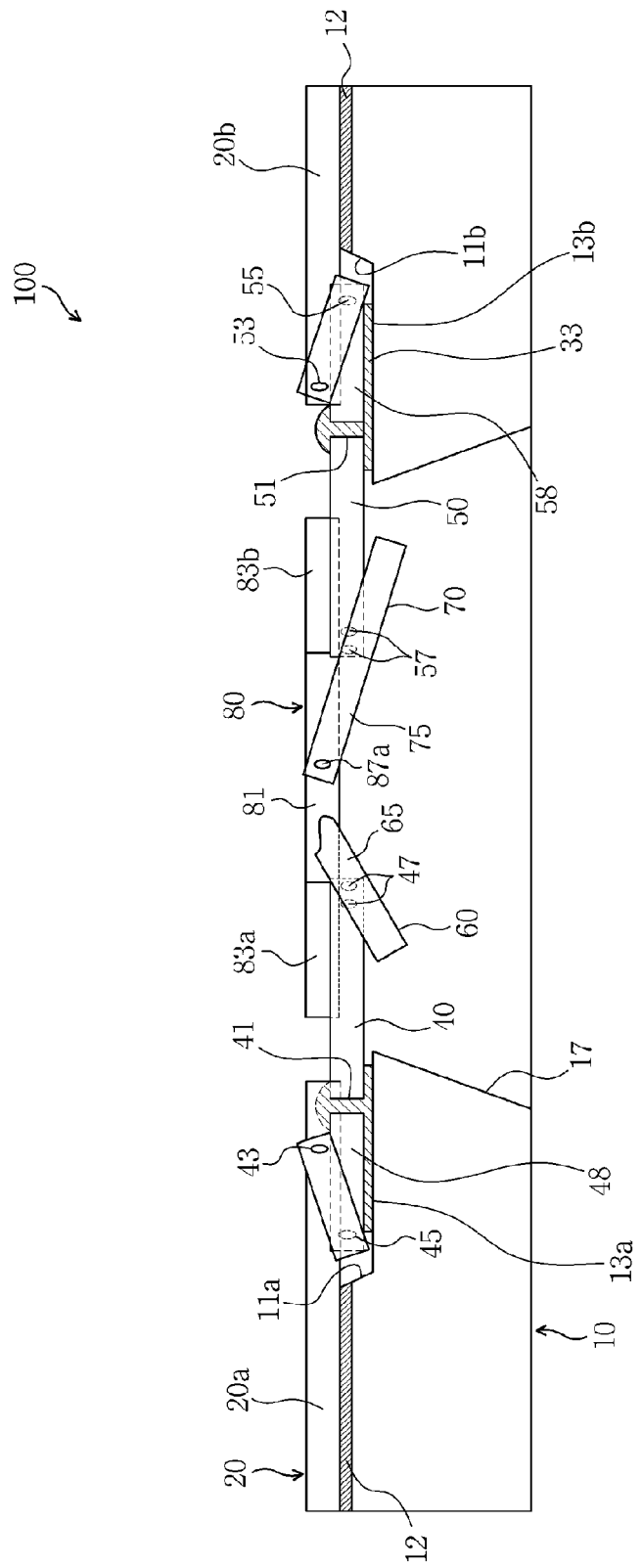
FIGS. 9 to 12 are views illustrating driving of an MEMS scanner according to an embodiment of the present invention.
Figure 10:
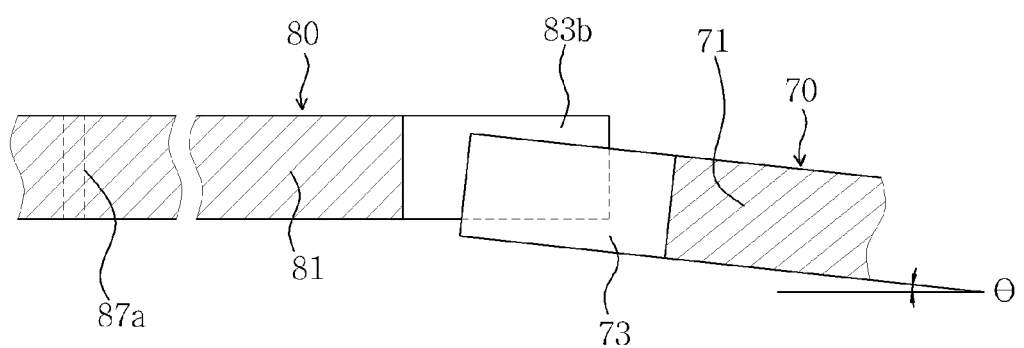

First, as shown in FIGS. 9 and 10, the fixed electrodes are inclined to the initial angle $\theta$ with respect to the driving electrodes 83a and 83b in the MEMS scanner 100 according to the present embodiment. In this case, referring to FIG. 10, the second fixed electrode 73 is inclined to the initial angle $\theta$ with respect to the second driving electrode 83b. Although not shown, the first fixed electrode 63 may also be inclined to the same initial angle $\theta$ with respect to the first driving electrode 83a.

Figure 11:
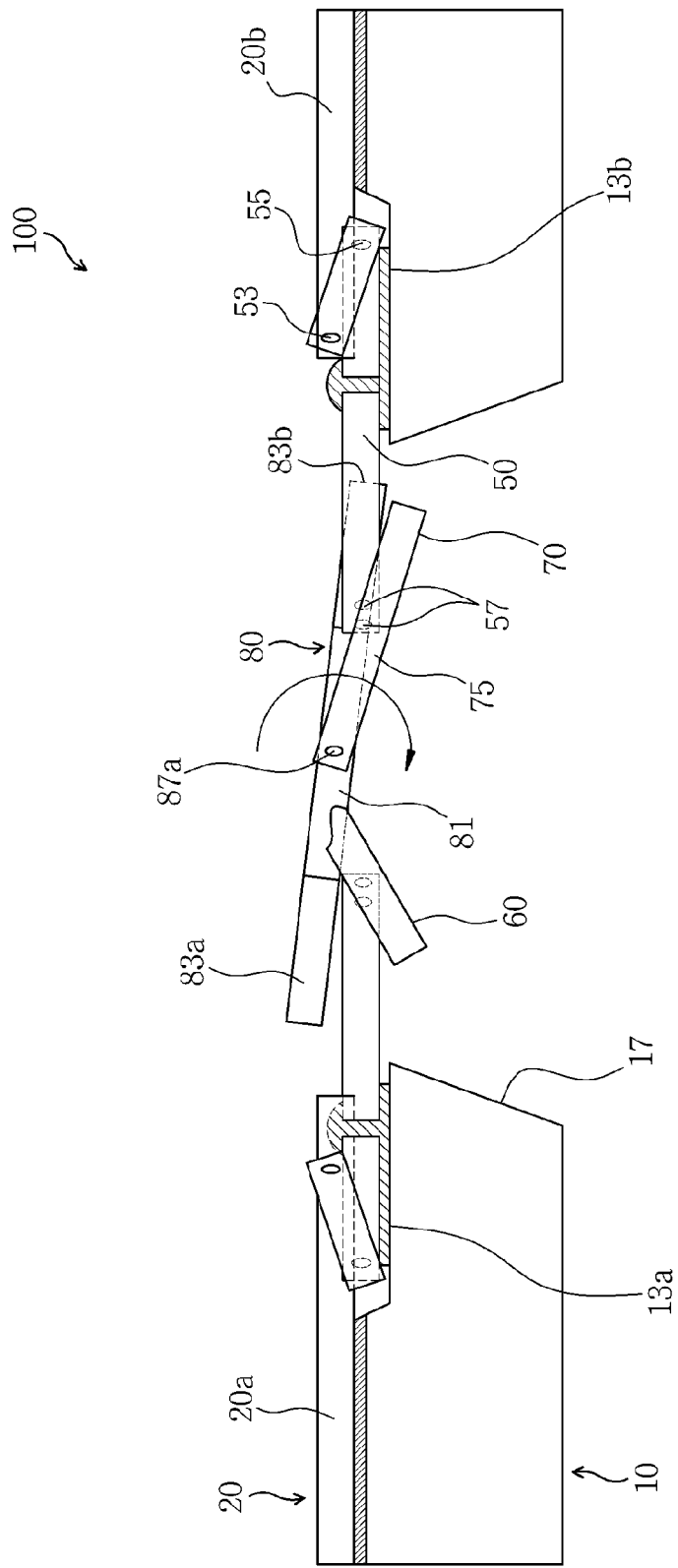
Figure 12:
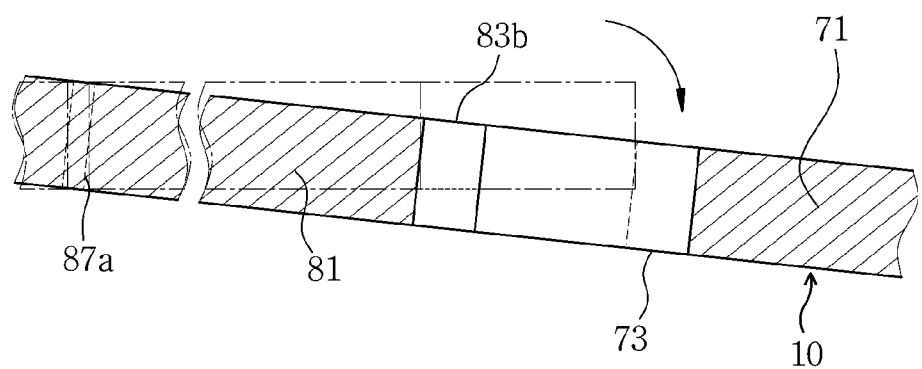

In this state, as shown in FIGS. 11 and 12, when a voltage is applied between the second fixed electrode portion 70 and the driving electrode portion 80 to generate a potential difference, the driving electrode portion 80 rotates in a clockwise direction toward the second fixed electrode portion 70 to which the voltage is applied. In this case, when the driving electrode portion 80 rotates to the maximum, the second driving electrode 83b is disposed in parallel on the second fixed electrode 73. In this case, a torsion elasticity force is accumulated on the rotational spring, and FIG. 12 illustrates that the torsion elasticity force is accumulated on the first rotational spring 87a.

When the voltage applied between the second fixed electrode portion 70 and the driving electrode portion 80 is blocked, the driving electrode portion 80 rotates in a counterclockwise direction using the torsion elasticity force accumulated on the rotational spring to restore to the original horizontal position.

On the contrary, when a voltage is applied between the first fixed electrode portion 60 and the driving electrode portion 80 to generate a potential difference, the driving electrode portion 80 rotates in a counterclockwise direction toward the first fixed electrode portion 60 to which the voltage is applied. In this case, when the driving electrode portion 80 rotates to the maximum, the first driving electrode 83a is disposed in parallel on the first fixed electrode.

When the voltage applied between the first fixed electrode portion 60 and the driving electrode portion 80 is blocked, the driving electrode portion 80 rotates in a clockwise direction using the torsion elasticity force accumulated on the rotational spring to restore to the original horizontal position.

The MEMS scanner 100 according to the present embodiment is a micro-actuator actuated by an electrostatic force, and may be implemented as a mirror scanner, lens scanner, or the like. For example, when a mirror is formed in the driving electrode frame 81 of the driving electrode portion 80, the MEMS scanner 100 is implemented as the mirror scanner. In this case, a metallic film may be deposited on the driving electrode portion 80 including the mirror and the fixed electrode portions 60 and 70. Gold or aluminum may be used to form the metallic film.

When a lens is coupled to the driving electrode frame 81 of the driving electrode portion 80, the MEMS scanner 100 is implemented as the lens scanner. In this case, a metallic film may be deposited on the driving electrode portion 80 and the fixed electrode portions 60 and 70 except the lens. Gold or aluminum may be used to form the metallic film.

Embodiments disclosed in the detailed description and the drawings are merely specific examples to help understanding, and are not intended to limit the scope of the present invention. It is apparent to those skilled in the art that other modifications may be made based on the technical spirit of the present invention in addition the embodiments disclosed herein.

The invention claimed is:

1. An MEMS scanner comprising:
a lower frame having cavities downward from an upper surface of the lower frame, and a through-hole formed between cavities;
a pair of upper frames attached to the upper surface of the lower frame near the cavities to form an installation space in a central portion between the upper frames;
a pair of levers disposed inside the respective upper frames, attached to both sides of a bottom surface of the cavities around the through-hole, and connected to the respective upper frames;
a pair of fixed electrode portions of which one sides are connected to the respective levers and the other sides are connected to the respective upper frames, the pair of fixed electrode portions having a plurality of fixed electrodes that are sloped toward an upper surface of the upper frames with respect to the bottom surface of the cavities and are formed toward the through-hole; and
a driving electrode portion having a plurality of driving electrodes formed at both sides thereof, wherein the plurality of driving electrodes are alternately disposed with respect to the fixed electrodes of the pair of fixed electrode portions and disposed in parallel on the upper surfaces of the respective upper frames, and sides opposite to the both sides in which the plurality of driving electrodes are disposed are attached to the upper surface of the lower frame using respective rotational springs,
wherein when a voltage is applied between the driving electrode portion and one of the pair of fixed electrode portions to generate a potential difference, the driving electrode portion rotates toward the fixed electrode portion to which the voltage is applied.

2. The MEMS scanner of claim 1, wherein the pair of upper frames comprise:
a first upper frame that surrounds an outer surface of a first lever of the pair of levers and is attached to the upper surface of the lower frame; and
a second upper frame that surrounds an outer surface of a second lever of the pair of levers, is attached to the upper surface of the lower frame, and forms an installation space in a central portion between the first and second upper frames,
wherein the pair of levers, the pair of fixed electrode portion, and the driving electrode portion are positioned in the installation space.

3. The MEMS scanner of claim 2, wherein the pair of fixed electrode portions are disposed to surround on outer surface of the driving electrode portion with the driving electrode portion as a center, and the levers are disposed rear of the pair of fixed electrode portions, respectively.

4. The MEMS scanner of claim 1, wherein each of the pair of levers comprises:
a pair of connection plates connected to the respective upper frames at both sides of the connection plates using a first lever hinge; and
lever plates in which both ends of one sides thereof are connected to the respective connection plates using a second lever hinge, the lever plates are fixed to the bottom surface of the cavities, and both ends of the other sides thereof are connected to the respective fixed electrode portions using a third lever hinge.

5. The MEMS scanner of claim 4, wherein each of the pair of levers has the third lever hinge positioned at a side closer to the through-hole with the first lever hinge as a center, and has the second lever hinge positioned at a side opposite to the side at which the third lever hinge is positioned.

6. The MEMS scanner of claim 4, wherein a plurality of adhesive injection holes are formed to penetrate each of the lever plates, and the lever plates are attached to the bottom surface of the respective cavities using the adhesive injected through the plurality of adhesive injection holes.

7. The MEMS scanner of claim 1, wherein each of the pair of fixed electrode portions comprises:
a fixed electrode frame connected to the lever using the third lever hinge;
a plurality of fixed electrodes arranged at one side of the fixed electrode frame toward the through-hole; and
a hinge installation piece extending to both sides of the fixed electrode frame with the plurality of fixed electrodes as a center, and connected to the fixed electrode frame using fixed hinges.

8. The MEMS scanner of claim 7, wherein the lower frame further comprises:
a hinge installation portion formed at both sides near the through-hole,
wherein the hinge installation pieces are disposed above the hinge installation portion.

9. The MEMS scanner of claim 7, wherein the fixed electrodes of the pair of fixed electrode portions are spaced from each other to form a space in which the driving electrode portion is installed.

10. The MEMS scanner of claim 9, wherein the driving electrode portion comprises:
a driving electrode frame disposed in a space between the fixed electrodes of the pair of fixed electrode portions;
a plurality of driving electrodes formed at sides of the driving electrode frame in which the fixed electrodes of the pair of fixed electrode portions face, and disposed alternately with respect to the fixed electrodes of the pair of fixed electrode portions;
a pair of spring installation pieces that are formed at both sides adjacent to sides in which the plurality of driving electrodes are formed, and are fixed to the upper surface of the lower frame; and
a pair of rotational springs connecting the spring installation pieces with the driving electrode frame.

11. The MEMS scanner of claim 10, wherein the fixed hinges and the rotational springs are disposed on the same axis.

12. The MEMS scanner of claim 10, wherein the fixed electrodes and the driving electrodes are interdigitated.

13. The MEMS scanner of claim 10, wherein when a voltage is applied between the driving electrode portion and one of the pair of fixed electrode portions to generate a potential difference, the driving electrode portion rotates toward the fixed electrode portion to which the voltage is applied, and the driving electrode portion is positioned in parallel on the rotating electrodes when the driving electrodes rotate to the maximum.

14. The MEMS scanner of claim 1, wherein when a voltage is applied between the driving electrode portion and one of the pair of fixed electrode portions to generate a potential difference, the driving electrode portion rotates toward the fixed electrode portion to which the voltage is applied, and the driving electrode portion is positioned in parallel on the rotating electrodes when the driving electrodes rotate to the maximum.

15. The MEMS scanner of claim 1, wherein a mirror is formed in the driving electrode frame of the driving electrode portion, or a portion of the driving electrode frame is penetrated and a lens is coupled to the penetrated portion.

16. The MEMS scanner of claim 1, wherein when a mirror is formed in a driving electrode frame of the driving electrode portion, a metallic film is deposited on the driving electrode portion including the mirror and the fixed electrode portions.

17. The MEMS scanner of claim 15, wherein the metallic film is formed of gold or aluminum.

18. The MEMS scanner of claim 1, wherein when a lens is coupled to a driving electrode frame of the driving electrode portion, a metallic film is deposited on the driving electrode portion and the fixed electrode portions except the lens.

19. The MEMS scanner of claim 18, wherein the metallic film is formed of gold or aluminum.

* * * * *